(12) United States Patent
Lee

(10) Patent No.: US 7,324,378 B2
(45) Date of Patent: Jan. 29, 2008

(54) METHOD OF DRIVING A PROGRAM OPERATION IN A NONVOLATILE SEMICONDUCTOR MEMORY DEVICE

(75) Inventor: Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 23 days.

(21) Appl. No.: 11/322,893

(22) Filed: Dec. 29, 2005

(65) Prior Publication Data

US 2006/0164890 A1    Jul. 27, 2006

(30) Foreign Application Priority Data

Jan. 24, 2005    (KR)    ............... 10-2005-0006202

(51) Int. Cl.
*G11C 11/34* (2006.01)

(52) U.S. Cl. ............... 365/185.17; 365/185.05; 365/185.16; 365/185.25; 365/185.33

(58) Field of Classification Search ........... 365/185.17, 365/230.05, 185.05, 185.16, 185.25, 185.33
See application file for complete search history.

(56) References Cited

U.S. PATENT DOCUMENTS 6,434,042 B1 *    8/2002    Lee et al. ............... 365/185.12

FOREIGN PATENT DOCUMENTS

| JP | 2000-40381 | 2/2000 |
| JP | 2004-145910 | 5/2004 |
| KR | 2000-0011896 | 2/2000 |

OTHER PUBLICATIONS

English language abstract of Korean Publication No. 2000-0011896.
English language abstract of Japanese Publication No. 2000-40381.
English language abstract of Japanese Publication No. 2004-145910.

* cited by examiner

*Primary Examiner*—Tuan T. Nguyen
*Assistant Examiner*—Pho M. Luu
(74) *Attorney, Agent, or Firm*—Marger Johnson & McCollom, P.C.

(57) ABSTRACT

In an embodiment, a method of driving a program operation in a nonvolatile semiconductor memory device is operable without discharging a bitline connected to a memory cell to be programmed between a program period and a verifying period. This remarkably improves programming speed and reduces current consumption.

16 Claims, 8 Drawing Sheets

METHOD OF DRIVING A PROGRAM OPERATION IN A NONVOLATILE SEMICONDUCTOR MEMORY DEVICE

CROSS-REFERENCE TO RELATED APPLICATIONS

This application claims foreign priority from Korean Patent Application 2005-0006202, filed on 24 Jan. 2005. Korean Patent Application 2005-0006202 is hereby incorporated by reference.

BACKGROUND

1. Technical Field

This disclosure relates to a method of driving a program operation in a nonvolatile semiconductor memory device.

2. Description of the Related Art

A general data programming operation in a nonvolatile semiconductor memory device is carried out by controlling a threshold voltage of a memory cell selected for programming. The word-line of the selected memory cell is supplied with a predetermined program voltage and a corresponding bitline is controlled according to data to be programmed. During this condition, the control for the threshold voltage of the selected memory cell is dependent on a voltage level of the corresponding bitline.

FIG. 1 is a timing diagram illustrating a conventional method of driving a program operation in a nonvolatile semiconductor memory device. In the conventional method there is a memory cell programming period P10 and a verifying period P20. During the memory cell programming period P10 the threshold voltage of a selected memory cell is increased by means of the voltage of a bitline BL that is connected to the selected memory cell. During this period, the bitline BL is charged with a ground voltage VSS (i.e., a programmable condition), while another bitline disconnected from the selected memory cell is set to a power source voltage VDD (i.e., program-inhibit condition). In the verifying period P20, a confirmation is made to check whether the selected memory cell, which has been processed in the programming period P10, is conditioned correctly, or has failed to be properly programmed. During this period, a data bit of the selected memory cell is loaded on the corresponding bitline BL. If the selected memory cell is determined to be in a program fail state in the verifying period P20, then the memory cell programming period P10 is repeated to correctly program the selected memory cell.

As shown in FIG. 1, during the sequence of the conventional program driving operation, a bitline discharging period P31 follows the memory cell programming period P10. Additionally, another bitline discharging period P32 follows the verifying period P20 and precedes the memory cell programming period P10'. In the discharging periods P31 and P32, all the bitlines BL drop to the ground voltage VSS. Also, during the threshold-voltage control processes T12 and T12', the word-line WL of the selected memory cell is supplied with a program voltage VPGM to control its threshold voltage. During a bitline reading process T22, the bitline BL voltage is determined by the data bit of the selected memory cell.

Due to the conventional method of driving a program operation in a nonvolatile semiconductor memory device, the discharging period P31 or P32 precedes a bitline precharging process T21 to re-precharge the bitline BL or a bitline setup process T11' to reset the bitline BL.

Thus, in the conventional method of driving a program operation, increased program time and unnecessary current consumption are required to program data for the selected memory cell due to the presence of two bitline discharging periods P31 and P32.

SUMMARY

According to embodiments of the invention, a method of driving a program operation in a nonvolatile semiconductor memory device is capable of reducing a program time and current consumption.

BRIEF DESCRIPTION OF THE DRAWINGS

The accompanying drawings are included to provide a further understanding of the invention, and are incorporated in and constitute a part of this specification. The drawings illustrate example embodiments of the invention and, together with the description, serve to explain principles of the invention.

DETAILED DESCRIPTION

Preferred embodiments of the invention are described below in more detail with reference to the accompanying drawings. The invention may, however, be embodied in different forms and should not be construed as limited to the embodiments set forth herein. Like numerals refer to like elements throughout the specification.

Figure 2:
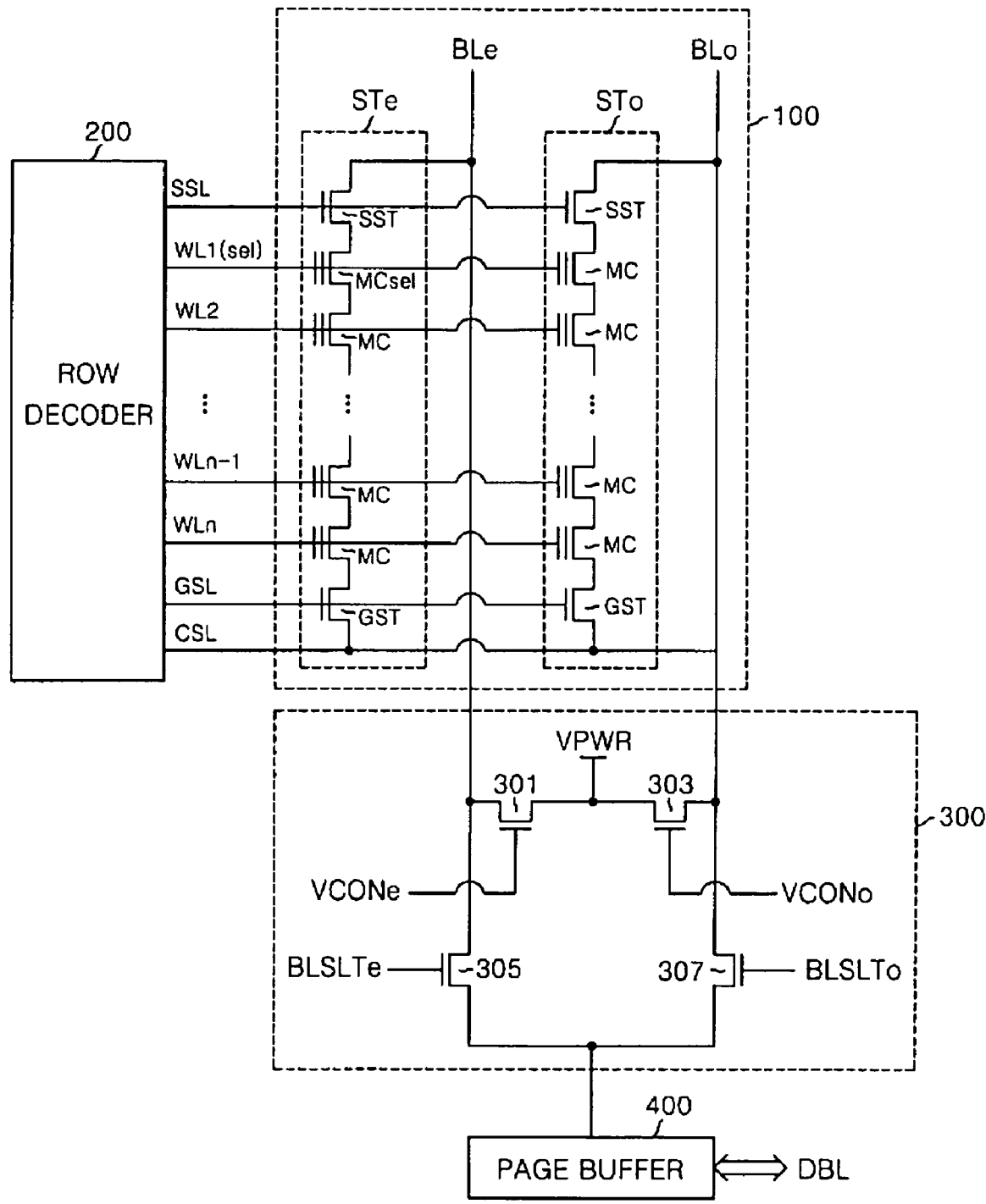
FIG. 2 is a circuit diagram illustrating a nonvolatile semiconductor memory device that is operable by a method in accordance with some embodiments of the invention.

FIG. 2 is a circuit diagram illustrating a nonvolatile semiconductor memory device operable by a method in accordance with some embodiments of the invention. Referring to FIG. 2, the nonvolatile semiconductor memory device includes a memory cell array 100 and a row decoder 200.

The memory cell array 100 is constructed with even and odd cell strings, STe and STo, correspondingly coupled to even and odd bitlines, BLe and BLo, respectively. The even and odd bitlines, BLe and BLo, together form a pair of bitlines. During a driving program operation, one of the bitline pair is selected while excluding the other. In other words, the even and odd bitlines, BLe and BLo, are controlled so they are not selected at the same time. During this program operation, the non-selected bitline (e.g., BLe or BLo) acts as a shielding line while a sensing operation is active for the selected bitline (e.g., BLo or BLe).

Each cell string STe or STo, as illustrated in FIG. 2, comprises a string selection transistor SST connected to its corresponding bitline BLe or BLo, a ground selection transistor GST connected to a common source line CSL, and memory cells MC connected between the string and ground selection transistors SST and GST. This configuration forms a NAND-type loop.

The string selection transistor SST is gated in response to a string selection signal SSL, while the ground selection transistor GST is gated in response to a ground selection signal GSL. Word-line signals WL1~WLn are selectively applied to control gates of the memory cells MC.

The string selection signal SSL, the ground selection signal GSL, and the word-line signals WL1~WLn are supplied from the row decoder 200. The structure and operation of the row decoder 200 is normally known by those skilled in the art, so it will not be described in detail.

Figure 3:
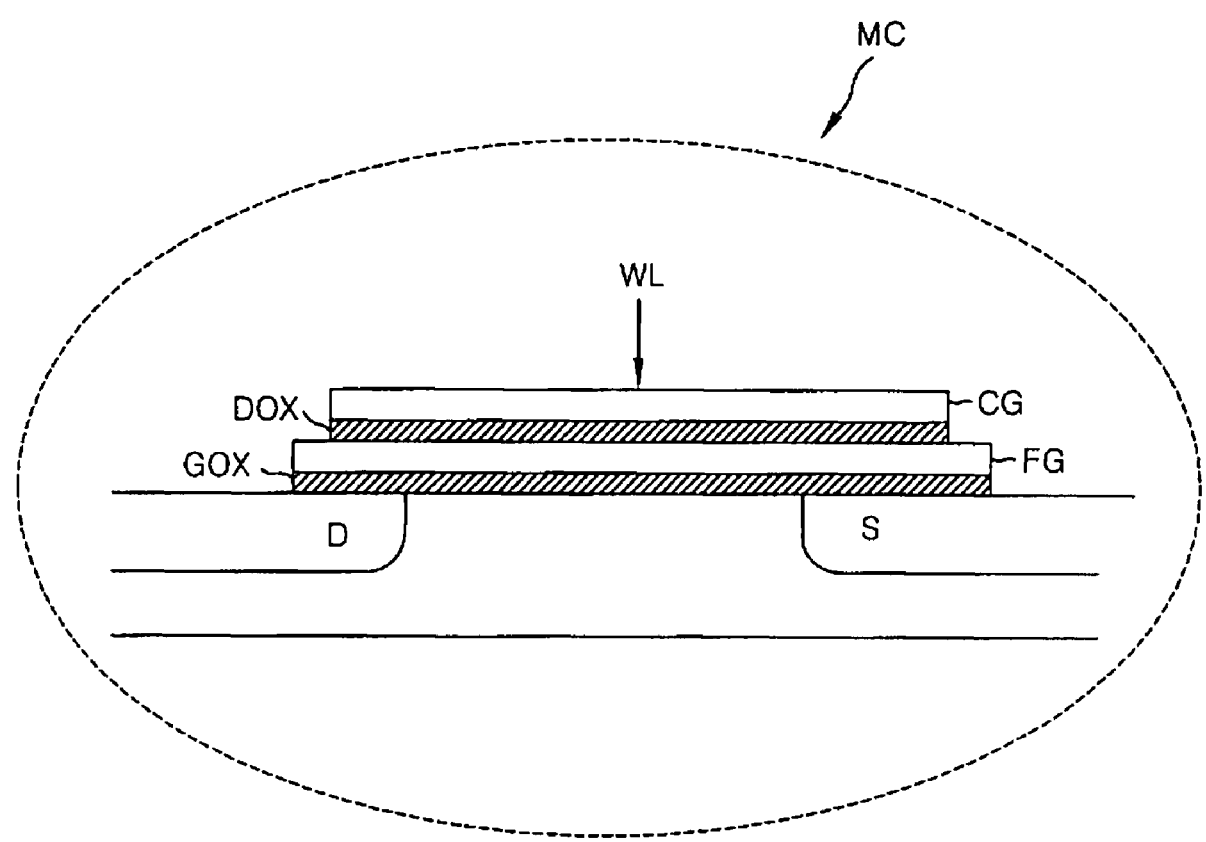
FIG. 3 is a cross-sectional diagram illustrating the structure of the memory cell shown in FIG. 2.

Each of the memory cells MC, as illustrated in FIG. 3, is formed of a floating gate transistor constructed of a source/drain S/D, a floating gate FG, and a control gate CG. As is well known, the memory cell MC is programmed by the effects of channel hot electron or Fowler-Nordheim tunneling, corresponding to a voltage level of its bitline BLe or BLo.

Returning to FIG. 2, the nonvolatile semiconductor memory device also includes a bitline-selecting bias circuit 300 and a page buffer 400.

The bitline-selecting bias circuit 300 connects the page buffer 400 to an alternating one of the even and odd bitlines BLe and BLo. Also, the bitline-selecting bias circuit 300 controls voltage levels of the even and odd bitlines BLe and BLo.

In the bitline-selecting bias circuit 300, a first NMOS transistor 301 controls whether the even bitline BLe is set to a virtual power voltage VPWR in response to an even control signal VCONe. The virtual power voltage VPWR is regulated at a proper level in accordance with activation of the nonvolatile semiconductor memory device. A second NMOS transistor 303 controls whether the odd bitline BLo is set to the virtual power voltage VPWR in response to an odd control signal VCONo.

Also, in the bitline-selecting bias circuit 300, a third NMOS transistor 305 connects the even bitline BLe to the page buffer 400 in response to an even selection signal BLSLTe. The fourth NMOS transistor 307 connects the odd bitline BLo to the page buffer 400 in response to an odd selection signal BLSLTo.

The page buffer 400 latches a data bit supplied by a data line DBL during a data input operation, and controls the even bitline BLe or the odd bitline BLo using the latched data bit. Further, during a data output operation, the page buffer 400 latches a data bit corresponding to a voltage level of the even bitline BLe or the odd bitline BLo and controls the data line DBL using the latched data bit. As the usual structure and operation of the page buffer is well known by those skilled in the art, it will not be described in detail.

The page buffer 400 may be implemented with various techniques and is not limited to the features of this embodiment.

Figure 4A:
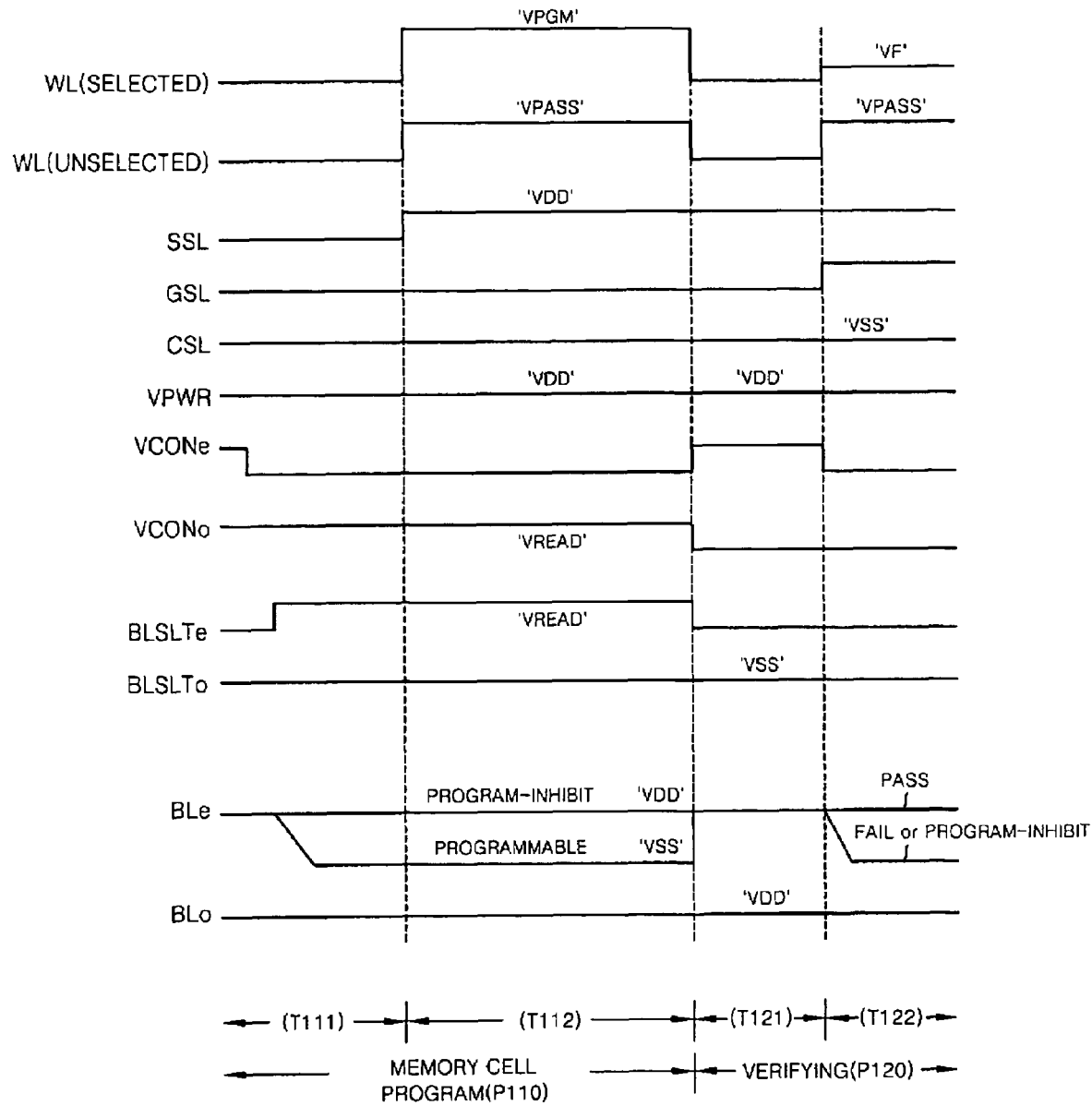
FIGS. 4A and 4B are timing diagrams illustrating the features of driving program operations for a nonvolatile semiconductor memory device in accordance with some embodiments of the invention.
Figure 4B:
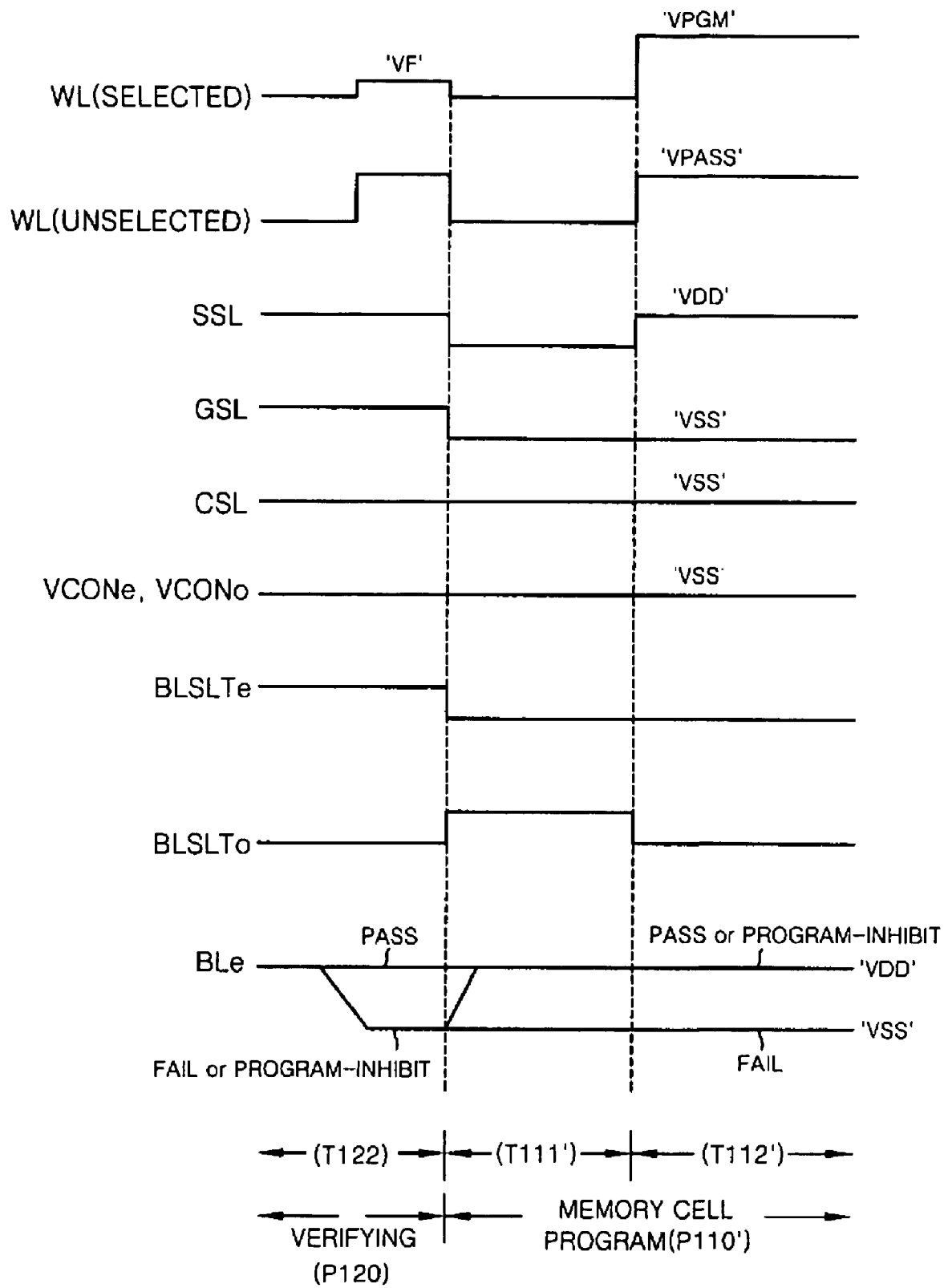

FIGS. 4A and 4B are timing diagrams illustrating program operations for a nonvolatile semiconductor memory device in accordance with some embodiments of the invention.

In this embodiment, it is hereinafter assumed, for convenience, that a selected memory cell MCsel (FIG. 2) is the first one connected to the even bitline BLe.

Referring to FIG. 4A, there is a memory cell programming period P110 and a verifying period P120. During the memory cell programming period P110, the threshold voltage of a selected memory cell MCsel is increased by means of a bitline voltage. The programming period P110 includes a bitline setup process T111 and a threshold-voltage control process T112.

During the bitline setup process T111, when the even control signal VCONe is set to the ground voltage VSS and the even selection signal BLSLTe reaches a read voltage VREAD (here, the read voltage VREAD is higher than the power source voltage VDD), the even bitline BLe is set to a voltage corresponding to a data bit to be programmed in the selected memory cell MCsel. If the data bit to be programmed is '0', the even bitline BLe is setup to the ground voltage VSS, which is a programmable state. Otherwise, if the data bit to be programmed is '1', then the even bitline BLe is set to the power source voltage VDD, which is a program-inhibit state.

Regarding the "odd" side of the circuit, during the bitline setup process T111, the virtual power voltage VPWR is the power source voltage VDD, the odd control signal VCONo is either the read voltage VREAD or the power source voltage VDD, and the odd selection signal BLSLTo is the ground voltage VSS. Thus, the odd bitline BLo is set to the power source voltage VDD, i.e., in the program-inhibit state.

In the threshold-voltage control process T112, the threshold voltage of the selected memory cell MCsel is increased to program the cell. In other words, the word-line WL1(sel) coupled to the selected memory cell MCsel is set to a predetermined program voltage VPGM, while other word-lines WL<2~n> of non-selected memory cells MC are set to a pass voltage VPASS and the string selection signal SSL is set to the power source voltage VDD.

Here, the program voltage VPGM is capable of forming a conducting channel in the selected memory cell MCsel and increasing its threshold voltage according to a voltage level of the even bitline BLe, which is in the range of about 15~20V. In other words, when the even bitline BLe is set to be near the ground voltage VSS, the threshold voltage of the selected memory cell MCsel, to which the program voltage VPGM is applied through its word-line WL1(sel), may be increased. But, when the even bitline BLe is set to be near the power source voltage VDD, the threshold voltage of the selected memory cell MCsel is not changed.

The pass voltage VPASS is a voltage level that is incapable of causing a variation in the threshold voltage of the corresponding memory cell MC, which is about 8V.

The method of driving the program operation in accordance with the present embodiment includes the verifying period P120. During the verifying period P120, a data read-out operation for the selected memory cell MCsel is carried out to check whether the selected memory cell MCsel has been successfully programmed. In a preferred embodiment the verifying period P120 includes a bitline precharging process T121 and a bitline read-out process T122.

During the bitline precharging process T121, the even bitline BLe is charged to a predetermined precharge voltage VPRE. The precharge voltage VPRE is a voltage level to find a data bit of the selected memory cell MCsel, and may be the same level as that of the power source voltage VDD, as shown in FIG. 4A. However, the precharge voltage VPRE may also be set to a voltage that is lower than VDD, for example, down to about half of the power source voltage VDD.

In the bitline read-out process T122, the even bitline BLe is set to a voltage level corresponding to the data bit of the selected memory cell MCsel.

Figure 1:
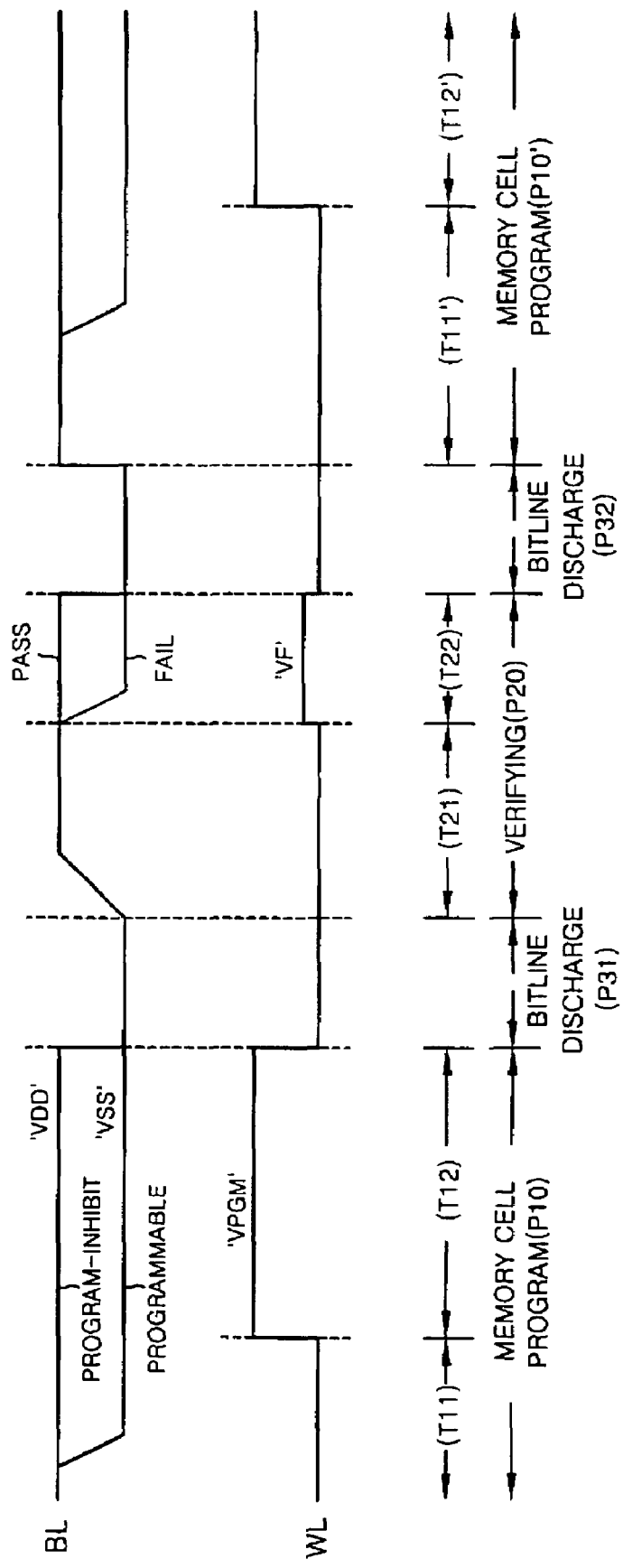
FIG. 1 is a timing diagram illustrating a conventional method of driving a program operation in a nonvolatile semiconductor memory device.

It is worth noting that the method of driving the program operation in the nonvolatile semiconductor memory device of FIG. 4A does not include the discharging processes for the even and odd bitlines BLe and BLo, as in the prior art illustrated by FIG. 1. That is, the bitline precharging process T121 of the verifying period P120 immediately follows the threshold-voltage control process T112 of the memory cell programming period P110 without the discharging processes.

For a data bit of '0' to be programmed in the selected memory cell MCsel, the even bitline BLe is initially set to the ground voltage VSS in the threshold-voltage control process T112. This has the same effect as discharging the even bitline BLe. Therefore, although there is no specific operation of discharging the even bitline BLe after completing the threshold-voltage control process T112 of the memory cell programming period T110, it is possible to find a programmed state of the selected memory cell MCsel in the verifying period P120.

If the selected memory cell MCsel was prevented from being programmed or was completely programmed at an earlier time, there is no reason to verify the programmed state of the selected memory cell. The page buffer 400 acts as a one-way latch by which a latched data bit is flipped in response to the voltage of the bitline BLe near to the power source voltage VDD during the verifying period P120. Thus, when the selected memory cell MCsel is held in the program-inhibit state, the latched data bit in the page buffer is not flipped even though a voltage level of the bitline BLe is low.

As explained above, the method of driving the program operation in the nonvolatile semiconductor memory device shown in FIG. 4A does not include the process of discharging the even bitline BLe to the ground voltage VSS between the threshold-voltage control process T112 of the program period P110 and the bitline precharging process T121 of the verifying period P120. As a result, the programming speed is improved.

Additionally, during the threshold voltage control process T112, the even bitline BLe is set to the ground voltage VSS when it is connected to a memory cell to be programmed. Conversely, the even bitline BLe is set to the power source voltage VDD when it is connected to a program-inhibited memory cell or a program-completed memory cell. Afterwards, during the bit line precharge process T121, the even bitline BLe is set to the precharge voltage VPRE, which may be the same as the power source voltage VDD.

In other words, the even bitline BLe is directly controlled with the precharge voltage VPRE. Therefore, a reduced current consumption is achieved compared to the conventional case where a bitline BL is always discharged to the ground voltage VSS before being set to the precharge voltage level.

FIG. 4B is a timing diagram that is subsequent to the timing diagram of FIG. 4A, and illustrates the sequence of resuming a programming operation after a verifying operation for a memory cell.

Referring to FIG. 4B, the method includes a bitline setup process T111' and a threshold-voltage control process T112' during a memory cell programming period P110'. First the bitline read-out process T122 in the verifying period P120 is executed. In the bitline read-out process T111', the even bitline BLe is set to a voltage level corresponding to a data bit of the selected memory cell MCsel. If the programmed state for the selected memory cell MCsel is verified (PASS), the even bitline BLe is set to a voltage level near the power source voltage VDD. Otherwise, if the programmed state for the selected memory cell MCsel does not pass verification (FAIL), the even bitline BLe is set to a voltage level near the ground voltage VSS.

During the verifying period P120, if the selected memory cell MCsel is detected as failing to be correctly programmed, the bitline setup process T111' and the threshold-voltage control process T112' are carried out.

In the bitline setup process T111', the even bitline BLe that has been held in the program-inhibit condition is set to the power source voltage VDD.

In the threshold-voltage control process T112', the threshold voltage of the selected memory cell MCsel is increased to program the selected memory cell MCsel, the same as the former threshold-voltage control process T111 shown in FIG. 4A. During this period, [such an operation is preferred to be carried out by an ISPP process that steps up] the program voltage is higher than that in the former process T111 of FIG. 4A.

In contrast to the conventional methods of FIG. 1, these embodiments do not include the discharging processes for the even and odd bitlines BLe and BLo after controlling the even bitline BLe in the bitline read-out process T122 and before the threshold-voltage control process T112'. That is, the threshold-voltage control process T112' is conducted immediately after the bitline read-out process T122 of the verifying period P120 without passing through the discharging processes for the even and odd bitlines BLe and BLo.

If the selected memory cell MCsel is detected as failing to be properly programmed, the even bitline BLe is initially set to the ground voltage VSS in the bitline read-out process T122. Otherwise, if the selected memory cell MCsel is detected as being successfully programmed (PASS), the even bitline BLe is set to the power source voltage VDD during the bitline read-out process T122.

In other words, by being discharged in the bitline read-out process T122, the even bitline BLe ends up in the same condition it would be in after the bitline setup process T111 of FIG. 4A. If the even bitline BLe was held in the program-inhibit state, it is set to the ground voltage VSS.

During the bitline setup process T111', the even bitline BLe that was in the program-inhibit condition during the bit line read-out process T122 is set to the power source voltage VDD. During the bitline setup process T111', the even bitline BLe is not controlled, regardless of whether it was confirmed as having failed or passed after programming.

Therefore, although the discharging process for the even and odd bitlines BLe and BLo is excluded, the threshold voltage of the selected memory cell MCsel is increased by the bitline setup process T111' and by the threshold control process T112' during the memory cell programming period P110'.

As was explained above, embodiments of the invention exclude the process of discharging the even and odd bitlines BLe and BLo between the verifying period P120 and the memory cell programming period P110'. As a result, program speed is improved. In addition, current consumption is reduced compared to the conventional case where the bitline BL is set high again after being discharged to the ground voltage VSS.

Summarizing the method of driving the program operation for the nonvolatile semiconductor memory device shown in FIGS. 4A and 4B, there is no operation for discharging the even bitline BLe between the verifying period P120 and the memory cell programming period P110 or P110'. As a result, program speed is improved and current consumption is reduced.

Electronic noise may occur during the bitline read-out process T122. In detail, the common source line CSL is set to the ground voltage VSS during the bitline read-out process T122. At this time a memory cell MC of the odd bitline BLo that is gated by the word-line WL1 may be set to an erased state. Then, charges of the odd bitline BLo are transferred to the common source line CSL, and this may cause the noise.

Also, coupling noise may occur during the bitline read-out process T122. In detail, the odd bitline BLo is in a floating state during the bitline read-out process T122. At this time, the odd bitline BLo may not shield the even bitlines. Then, the even bitline BLe is coupled to the adjacent odd bitline BLo. And the odd bitline BLo is coupled to other even bitlines BLe, and this may cause coupling noise between the even bitlines.

Figure 5:
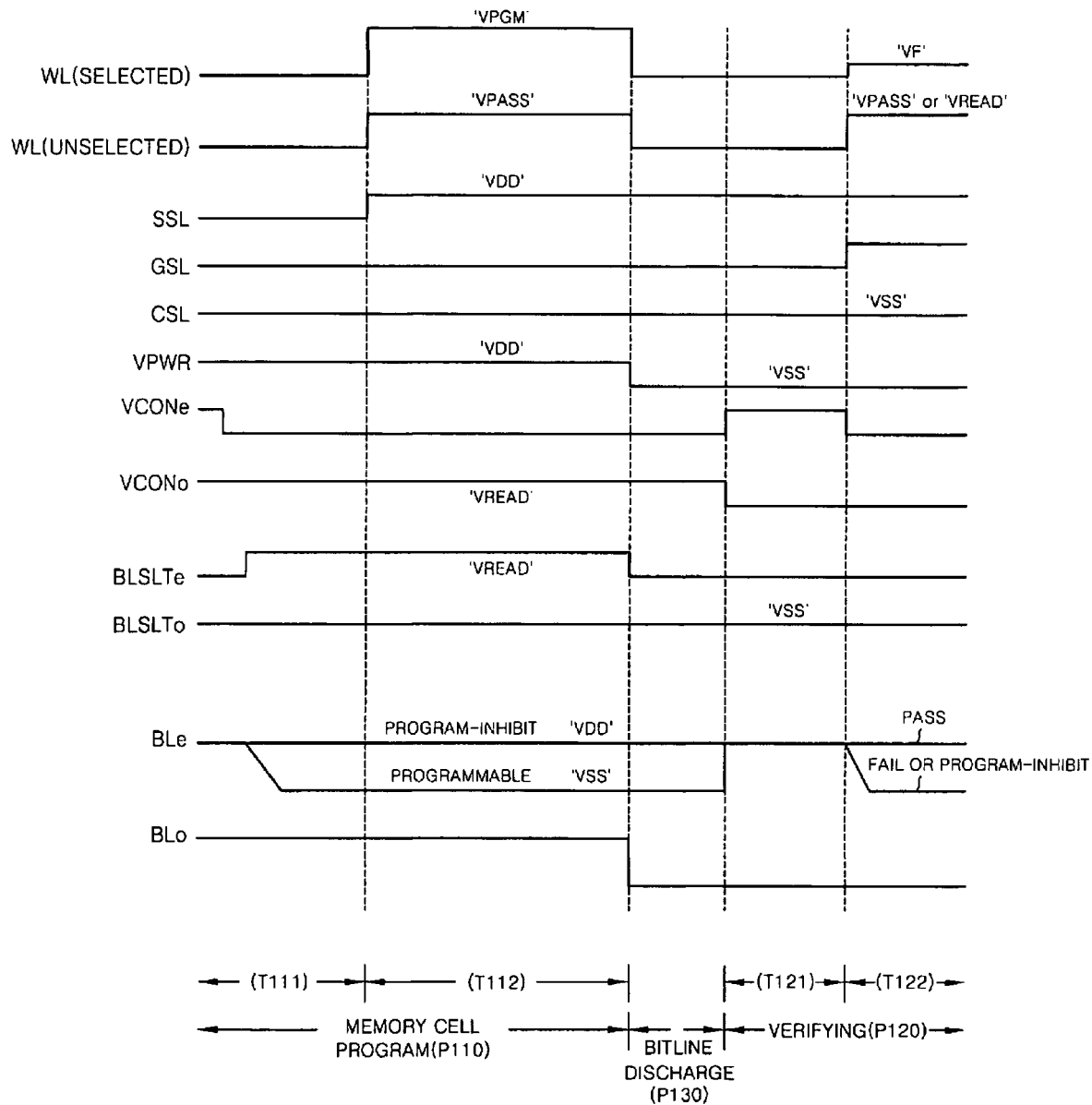
FIG. 5 a timing diagram illustrating the features of driving a program operation for a nonvolatile semiconductor memory device in accordance with some embodiments of the invention.

FIG. 5 illustrates a method of driving a program operation in a nonvolatile semiconductor memory device according to some embodiments of the invention, where the method is capable of preventing the electronic and coupling noise discussed above.

The method of FIG. 5 is similar to that of FIG. 4A, except that a bitline discharging period P130 is interposed between the threshold-voltage control process T112 and the bitline precharging process T121 of the verifying period P120.

During the bitline discharging period P130, the odd bitline BLo is discharged to the ground voltage VSS and therefore the electronic noise and coupling noise are prevented from the common source line CSL.

However, it can be seen that there is still no discharging operation for the even bitline BLe (as a selected bitline) to the ground voltage VSS. Consequently, the bitline discharging period P130 employed in the method of FIG. 5 is distinguished from the bitline discharging period P31 of in FIG. 1, where all bitlines BL are discharged to the ground voltage VSS.

Because a discharging process for the even bitline BLe (as a selected bitline) does not occur in the method of FIG. 5, there is an advantage of a reduced current consumption.

Figure 6:
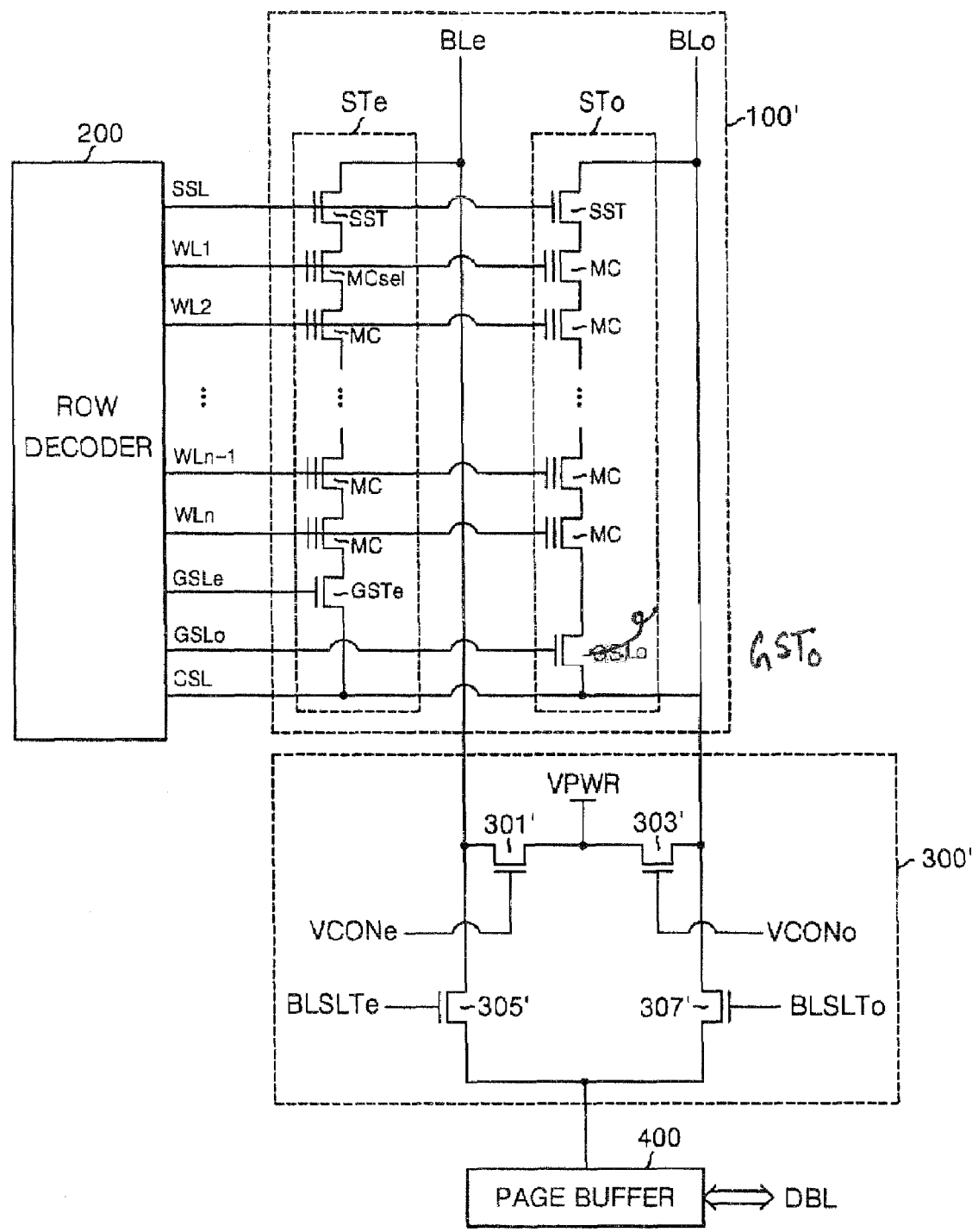
FIGS. 6 and 7 are circuit diagrams illustrating other configurations for a nonvolatile semiconductor memory device that are operable according to some embodiments of the invention.
Figure 7:
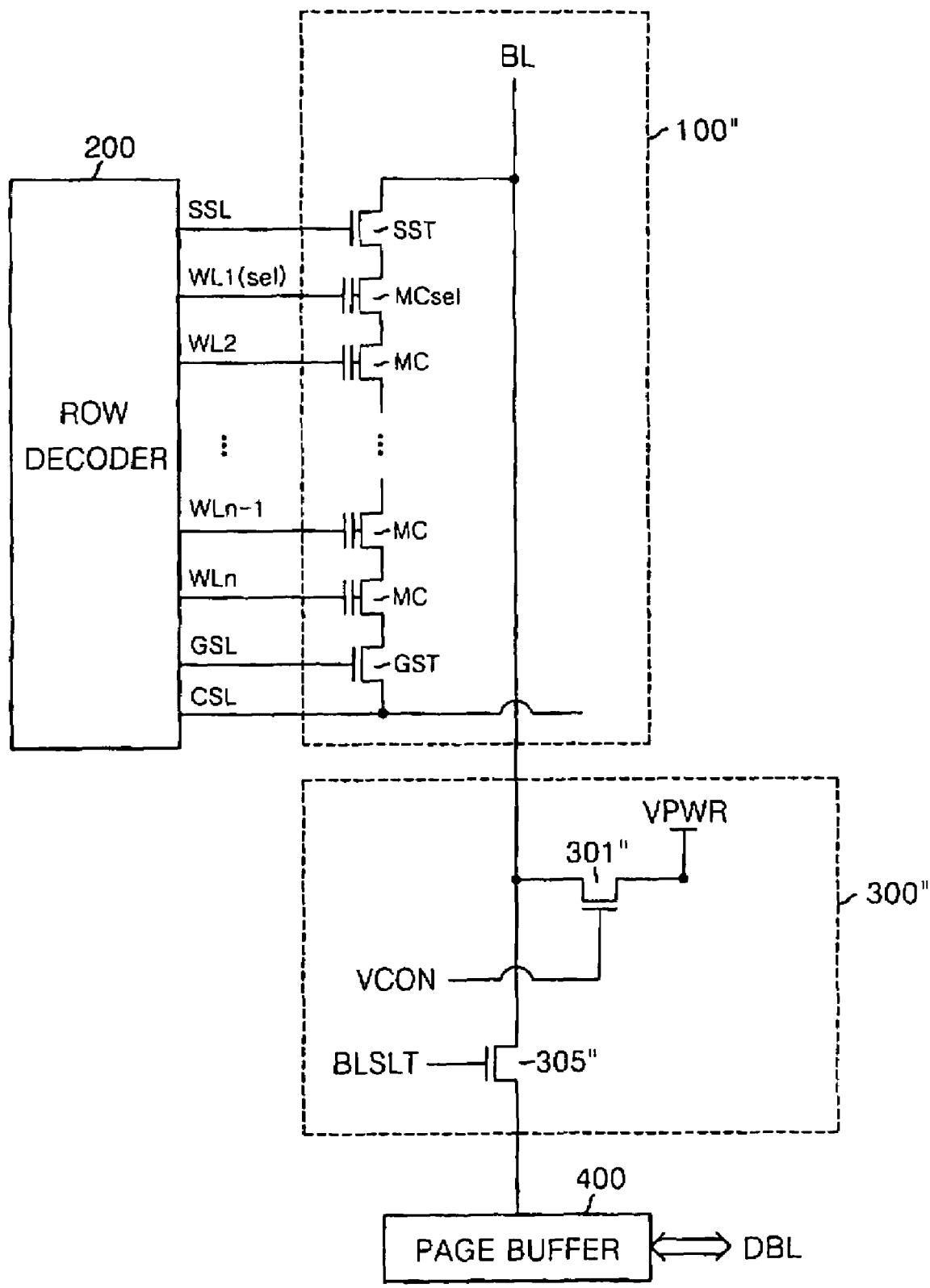

FIGS. 6 and 7 are circuit diagrams illustrating other configurations for a nonvolatile semiconductor memory device that are operable according to some embodiments of the invention.

The construction of FIG. 6 is similar to that of FIG. 2. However, the device of FIG. 6 is different in that the ground selection transistors, GSTe and GSTo, of the even and odd bitlines BLe and BLo, respectively, are each gated by different ground selection signals GSLe and GSLo.

In the nonvolatile semiconductor memory device shown in FIG. 6, even the method of driving the program operation illustrated in FIG. 4A is applicable to prevent the generation of noise on the common source line CSL and between the even bitlines. In detail, despite the operation of discharging the odd bitline BLo to the ground voltage VSS, the noise on the common source line CSL and between the even bitlines may be prevented if the ground selection transistor GSTo of the odd bitline BLo is turned off.

FIG. 7 is a circuit diagram illustrating still another embodiment of the invention. When a nonvolatile semiconductor memory device is configured so that the page buffer 400 is connected to a single bitline BL, there is no generation of noise on the common source line CSL and between the even bitlines.

The invention may be practice in many ways. What follows are exemplary, non-limiting descriptions of some embodiments of the invention.

According to some embodiments of the invention, a method of driving a program operation in a nonvolatile semiconductor device having an even and odd bitline and memory cells that are electrically connected to the corresponding even and odd bitline includes the processes of alternately selecting the even and odd bitlines, controlling a threshold voltage of a selected memory cell to be programmed, the memory cell connected to a selected one of the even and odd bitlines, discharging the non-selected one of the even and odd bitlines to a ground voltage, and verifying the data of the selected memory cell. According to this method, the selected bitline is not discharged to a ground voltage after the process of controlling the threshold voltage or before the process of verifying the data of the selected memory cell.

Although the invention has been described in connection with the embodiments illustrated in the accompanying drawings, it is not limited thereto. It will be apparent to those skilled in the art that various substitution, modifications, and changes may be made thereto without departing from the scope and spirit of the invention.

For instance, while these embodiments describe the feature that the selected memory cell is connected to the even bitline, the selected memory cell may be connected to the odd bitline. In this case, the even bitline is just substituted with the odd bitline as the bitline coupled to the selected memory cell, and this does not change the achievements of the objects of the invention in substance.

Rather, these embodiments are provided so that this disclosure will be thorough and complete, and will fully convey the scope of the invention through the claims thereof to those skilled in the art.

The invention claimed is:

1. A method of driving a program operation in a nonvolatile semiconductor memory device having a pair of even and odd bitlines, and a plurality of memory cells electrically connected to each of the even and odd bitlines, the even and odd bitlines being alternately selectable, the method comprising:
    controlling a threshold voltage of a selected memory cell to be programmed, according to a voltage level of the selected bitline, the selected memory cell being connected to a selected one of the even and odd bitlines;
    discharging the non-selected one of the even and odd bitlines to a ground voltage; and
    verifying data of the selected memory cell that is programmed,
    wherein an operation for discharging the selected bitline to the ground voltage is excluded before the verifying data and after the controlling the threshold voltage.

2. The method as set forth in claim 1, wherein the verifying data comprises precharging the selected bitline to a predetermined precharge voltage, and wherein the operation for discharging the selected bitline to the ground voltage is excluded before the precharging the selected bitline and after the controlling the threshold voltage.

3. The method as set forth in claim 1, wherein the nonvolatile semiconductor memory device is a NAND type.

4. The method as set forth in claim 1, further comprising, before the controlling the threshold voltage, setting the selected bitline to a voltage corresponding to data to be programmed in the selected memory cell and setting the non-selected bitline in a program-inhibit condition.

5. The method as set forth in claim 1, wherein the verifying data comprises precharging the selected bitline to a predetermined precharge voltage, and wherein the operation for discharging the selected bitline to the ground voltage is excluded before the precharging the selected bitline and after the controlling the threshold voltage.

6. The method as set forth in claim 1, further comprising, before the controlling the threshold voltage, setting the selected bitline to a voltage corresponding to data to be programmed in the selected memory cell and setting the non-selected bitline in a program-inhibit condition.

7. A method of driving a program operation in a nonvolatile semiconductor memory device having a pair of even and odd bitlines, and a plurality of memory cells electrically connected to each of the even and odd bitlines, the even and odd bitlines being alternately selectable, the method comprising:

controlling a threshold voltage of a selected memory cell to be programmed, according to a voltage level of the selected bitline, the selected memory cell being connected to a selected one of the even and odd bitlines; and verifying data of the selected memory cell that is programmed, wherein an operation for discharging the selected bitline to the ground voltage is excluded before the verifying data and after the controlling the threshold voltage.

8. The method as set forth in claim 7, wherein the nonvolatile semiconductor memory device is a NAND type.

9. A method of driving a program operation in a nonvolatile semiconductor memory device having a pair of even and odd bitlines, and a plurality of memory cells electrically connected to each of the even and odd bitlines, the even and odd bitlines being alternately selectable, the method comprising:

controlling a selected one of the even and odd bitlines to be at a voltage level corresponding to data of a selected memory cell that is connected to the selected bitline; and controlling a threshold voltage of the selected memory cell, according to the voltage level of the selected bitline, wherein an operation for discharging the selected bitline to the ground voltage is excluded before the controlling the threshold voltage and after controlling the selected bitline.

10. The method as set forth in claim 9, wherein the nonvolatile semiconductor memory device is a NAND type.

11. A method of driving a program operation in a nonvolatile semiconductor memory device having a bitline and a plurality of memory cells electrically connected to the bitline, the method comprising:

controlling a threshold voltage of a selected memory cell, which is connected to the bitline to be programmed, according to a voltage level of the bitline; and verifying data of the selected memory cell, wherein an operation for discharging the bitline to the ground voltage is excluded before the verifying the data and after the controlling the threshold voltage.

12. The method as set forth in claim 11, wherein the verifying comprises precharging the bitline to a predetermined precharge voltage, and wherein the operation for discharging the bitline to the ground voltage is excluded before the precharging the bitline after the controlling the threshold voltage.

13. The method as set forth in claim 11, wherein the nonvolatile semiconductor memory device is a NAND type.

14. The method as set forth in claim 11, which further comprises, before the controlling the threshold voltage, setting the bitline to a voltage corresponding to data to be programmed in the selected memory cell.

15. A method of driving a program operation in a nonvolatile semiconductor memory device having a bitline and a plurality of memory cells electrically connected to the bitline, the method comprising:

controlling the bitline to be at a voltage level corresponding to data of a selected memory cell that is connected to the bitline; and controlling a threshold voltage of the selected memory cell, which is connected to the bitline to be programmed, according to the voltage level of the bitline, wherein an operation for discharging the bitline to the ground voltage is excluded before the controlling the threshold voltage and after the controlling the bitline.

16. The method as set forth in claim 15, wherein the nonvolatile semiconductor memory device is a NAND type.

* * * * *